United States Patent [19]

Walko, II

[11] Patent Number: 6,051,100
[45] Date of Patent: Apr. 18, 2000

[54] HIGH CONDUCTANCE PLASMA CONTAINMENT STRUCTURE

[75] Inventor: Joseph Philip Walko, II, Jericho, Vt.

[73] Assignee: International Business Machines Corporation, Armonk, N.Y.

[21] Appl. No.: 08/957,412

[22] Filed: Oct. 24, 1997

[51] Int. Cl.[7] .............................. H05H 1/00; C23C 16/00
[52] U.S. Cl. .................. 156/345; 118/723 R; 118/723 E
[58] Field of Search ........................... 118/723 R, 723 E; 156/345 P

[56] References Cited

U.S. PATENT DOCUMENTS

| | | | |
|---|---|---|---|
| 4,384,938 | 5/1983 | Desilets et al. | 204/298 |
| 4,717,448 | 1/1988 | Cox et al. | 156/643 |
| 5,074,985 | 12/1991 | Tamura et al. | 204/298.11 |
| 5,210,466 | 5/1993 | Collins et al. | 156/345 |
| 5,221,425 | 6/1993 | Blanchard et al. | 156/643 |
| 5,498,313 | 3/1996 | Bailey et al. | 156/643.1 |
| 5,534,751 | 7/1996 | Lenz et al. | 156/345 |
| 5,605,637 | 2/1997 | Shan et al. | 216/71 |
| 5,639,334 | 6/1997 | Camale et al. | 156/345 |

FOREIGN PATENT DOCUMENTS

| | | | |
|---|---|---|---|
| 7245295 | 9/1995 | Japan . | |
| 11040398 | 2/1999 | Japan | H05H 1/46 |

*Primary Examiner*—Timothy Meeks
*Assistant Examiner*—Parviz Hassanzadeh
*Attorney, Agent, or Firm*—DeLio & Peterson, LLC; Peter W. Peterson; Robert A. Walsh

[57] ABSTRACT

Plasma containment is achieved within a region by a containment plate while gas is allowed to flow through this region by openings in the plate. The openings in the plate are larger in two of the cross-sectional dimensions parallel to the plate surface than the thickness of the dark space or plasma sheath. This plasma containment plate allows high conductance for conditions including those of long molecular mean free path and thick material deposits on the interior chamber of the plasma reactor.

49 Claims, 4 Drawing Sheets

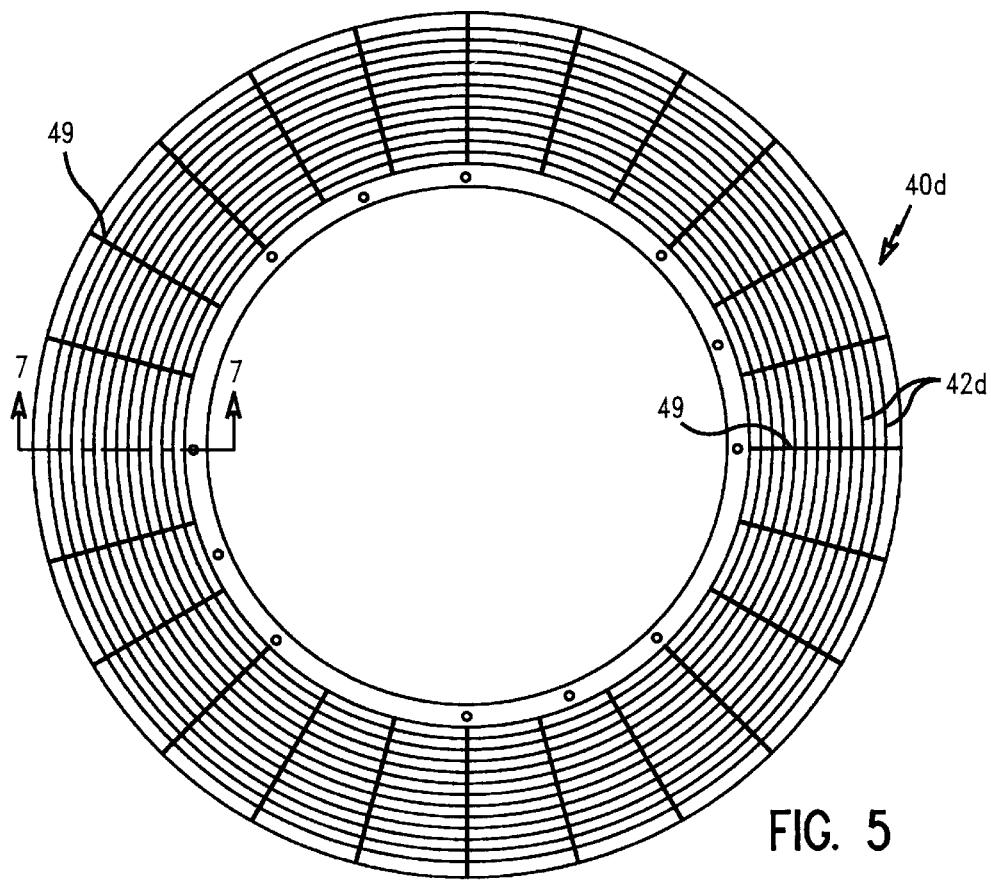
FIG. 5
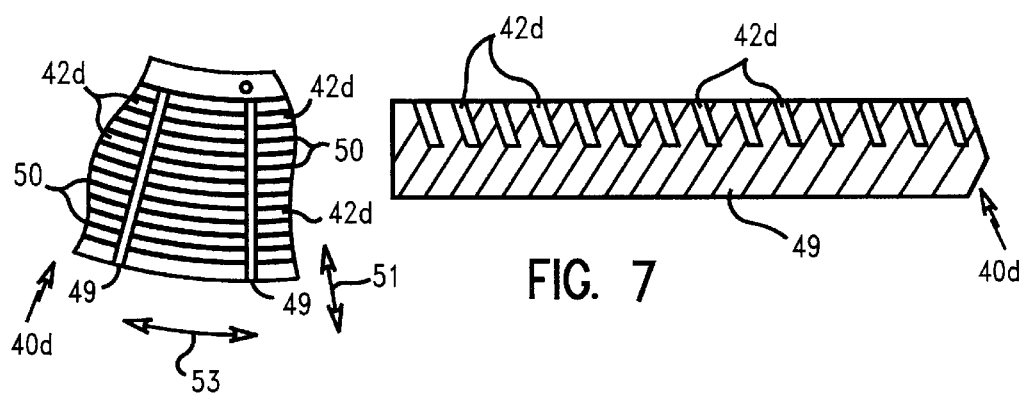
FIG. 6
FIG. 7

HIGH CONDUCTANCE PLASMA CONTAINMENT STRUCTURE

BACKGROUND OF THE INVENTION

1. Field of the Invention

The present invention relates to a structure utilized to contain a plasma and/or electromagnetic field within a desired space while maintaining high conductance across the structure and permitting gas flow through the structure.

2. Description of Related Art

Plasma processing is often used under circumstances where it is beneficial to restrict the presence of the plasma to a certain region in the chamber while maintaining the ability to flow gasses through the plasma containing region. Several methods of plasma containment are currently in practice, including magnetic confinement, inertial confinement and confinement by solid or nearly barriers. Inertial confinement works only for short periods of time and has been shown useful only in power generating and explosive devices. Magnetic confinement has strong limitations in its application to many industrial applications. Because of the shortcomings of inertial and magnetic confinement systems, industrial plasma confinement is most often achieved by using a physical barrier within the chamber to confine the plasma.

For systems confining the plasma by physical barriers, this has been accomplished by placing openings in the physical barrier for the gases to flow through. Plasma confinement has been maintained by making at least one dimension of the cross section of these openings similar in size or smaller than the plasma sheath or dark space as disclosed in U.S. Pat. Nos. 4,384,938 and 5,605,637. However, utilizing such small holes in the physical barrier has been found to lead to low conductance, particularly when the molecular mean free path is similar to or longer than the dark space. Further, these small holes tend to clog in the presence of a depositing chemistry such as is typically used in selective etching. This clogging not only restricts the useful lifetime of the chamber but creates continually changing process conditions which can reduce process yields.

In the case of highly selective etch chambers utilized in the semiconductor manufacturing industry, it is common to have plasma conditions where the molecular mean free path is long compared to the dark space of the RIE chamber and where there is the problem of film deposit on the physical barrier. Accordingly, there is a long-felt need for plasma barriers in RIE systems that have a high, relatively stable conductance and excellent plasma confinement properties even when the molecular mean free path is long compared to the dark space and/or when a film is being deposited on the barrier.

Bearing in mind the problems and deficiencies of the prior art, it is therefore an object of the present invention to provide a barrier useful in systems that has a high, relatively stable conductance.

It is another object of the present invention to provide a barrier useful in systems that has excellent plasma confinement properties even when the molecular mean free path is long compared to the dark space.

A further object of the invention is to provide a barrier useful in systems that has excellent plasma confinement properties even when a film is being deposited on the barrier.

It is yet another object of the present invention to provide a system that incorporates a barrier having the aforementioned advantages.

SUMMARY OF THE INVENTION

The above and other objects and advantages, which will be apparent to one of skill in the art, are achieved in the present invention which is directed to, in a first aspect, a containment structure for a plasma which includes means for containing a plasma, that is sustained by an electromagnetic field, within a desired space by attenuating the electromagnetic field outside of the space to levels which do not sustain the plasma while maintaining high conductance across the containment structure; and which further includes means for permitting gas flow through the containment structure.

In a related aspect, the present invention provides a plasma reactor containing a reactor chamber adapted to create and sustain a plasma in a space therein, along with a containment structure. The containment structure includes means for containing a plasma within a desired portion of space in the chamber by attenuating an electromagnetic field generated in the chamber while maintaining high conductance across the containment structure; and means for permitting gas flow within the chamber and through the containment structure.

The means for permitting gas flow may comprise openings through the structure. The means for containing a plasma may comprise conductive surfaces oriented in a direction less than or substantially equal to 90° from the direction of the electric field or Poynting vector, at the opening, of the energy source sustaining the plasma.

The plasma has a plasma sheath and two dimensions of the openings along a surface of the containment structure are greater than the plasma sheath. The structure preferably comprises spaced, overlapping conductive surfaces.

Preferably, the means for containing a plasma comprises conductive surfaces oriented in a direction less than or substantially equal to 90° from the direction of the electric field at the opening. The conductive surfaces may form the openings, or dielectric material layers over the conductive surfaces may form the openings. The means for containing a plasma maintains high conductance in the presence of deposits from the plasma on the containment structure.

In another aspect, the present invention provides a plasma reactor comprising a reactor chamber adapted to create and sustain an active plasma in a space therein and a plasma containment structure. The plasma containment structure includes means for containing an active plasma within a desired portion of space in the chamber on one side of the structure by attenuating an electromagnetic field generated in the chamber and permitting passage of ionized molecules while maintaining high conductance across the containment structure. The containment structure may permit formation of a cold plasma on the other side of the structure. The containment structure also includes means for permitting gas flow within the chamber and through the containment structure.

The means for permitting gas flow may comprise openings through the structure. The means for containing a plasma may comprise conductive surfaces oriented in a direction less than or substantially equal to 90° from the direction of the electric field at the opening. The plasma has a plasma sheath and two dimensions of the openings parallel to a surface of the containment structure should be greater than the plasma sheath.

In a further aspect, the present invention relates to a containment structure for containing an electromagnetic field and a plasma having a surrounding plasma sheath. The containment structure comprises a structure made of an electrically conductive material configured to contain a plasma within a desired space by attenuating an electromagnetic field outside of the space while maintaining high conductance across the structure. The structure contains openings therethrough for permitting gas flow within the chamber, and the openings have two dimensions on a surface of the containment structure greater than the plasma sheath.

The two dimensions of the openings may be greater than the molecular mean free path of the plasma, and all dimensions of the openings may be greater than the plasma sheath. The structure may comprise spaced, overlapping conductive surfaces and the conductive surfaces may form the openings for the gas flow.

In yet another aspect, the present invention relates to a plasma reactor comprising a reactor chamber adapted to create and sustain a plasma in a space containing an electromagnetic field and a containment structure in the chamber. The containment structure is made of an electrically conductive material and is configured to contain a plasma within a desired space in the chamber by attenuating an electromagnetic field generated in the chamber while maintaining high conductance across the structure. The structure contains openings therethrough for permitting gas flow within the chamber, the openings having two dimensions parallel to a surface of the containment structure greater than the plasma sheath. The structure may comprise a plurality of containment plates adapted to progressively attenuate the plasma and electric field. The structure may comprise spaced, overlapping conductive surfaces, and the spaces between the surfaces may comprise the openings for the gas flow.

The containment structure may further contain struts connecting the conductive surfaces, and the struts may be placed opposite the surface of the structure facing toward the plasma. The openings have surrounding walls, and the walls may be oriented in a direction less than or substantially equal to 90° from the direction of the electric field at the opening. The openings may be annular and the structure may have a dielectric coating thereover.

The containment structure has a surface facing the plasma and the openings have surrounding walls. Preferably, the angle between the top surface and a portion of the walls is less than 90°. More preferably, the containment structure surface facing the plasma between the openings is concave. The surrounding walls of the openings may contain electrically conductive surfaces.

It is also preferred that the structure contain overlapping conductive surfaces oriented to prevent line of sight transmission of a vector in the direction of the electric field at the opening to attenuate an electromagnetic field. The openings have a width and a depth, and the ratio of the width to depth of the openings may vary across the structure as a function of strength of the electromagnetic field.

In another aspect, the present invention relates to a containment structure for a chamber containing an electromagnetic field. The containment structure comprises a structure made of an electrically conductive material configured to contain an electromagnetic field within a desired space in the chamber by attenuating the field generated in the chamber while maintaining high conductance across the structure. The structure contains openings having surrounding conductive surfaces therethrough for permitting gas flow within the chamber, the openings having a width and a length such that the ratio of the width to length of the openings is sufficient to attenuate the electromagnetic field, the surfaces being oriented in a direction less than or substantially equal to 90° from the direction of the electromagnetic field at the opening.

In a related aspect, the present invention provides a chamber containing an electromagnetic field and including a containment structure. The containment structure comprises a plate made of an electrically conductive material configured to contain an electromagnetic field within a desired space in the chamber by attenuating the field generated in the chamber while maintaining high conductance across the plate. The plate contains openings having surrounding conductive surfaces therethrough for permitting gas flow within the chamber. The openings have a width and a length such that the ratio of the width to length of the openings is sufficient to attenuate the electromagnetic field, the surfaces being oriented in a direction less than or substantially equal to 90° from the direction of the electromagnetic field at the opening.

The reactor chamber described above may contain an anode and a cathode, and the plasma reactor of the present invention is particularly suitable for reactive ion etching.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 5 is a bottom (facing the weaker electromagnetic field) plan view of a containment plate constructed in accordance with the present invention.

FIG. 6 is an enlargement of a portion of FIG. 5 showing a close-up view of the annular openings between the rings and struts of the containment plate.

FIG. 7 is a vertical sectional view of the containment plate along line 7—7 of FIG. 5 showing the openings and supporting strut.

DESCRIPTION OF THE PREFERRED EMBODIMENT(S)

Figure 1:
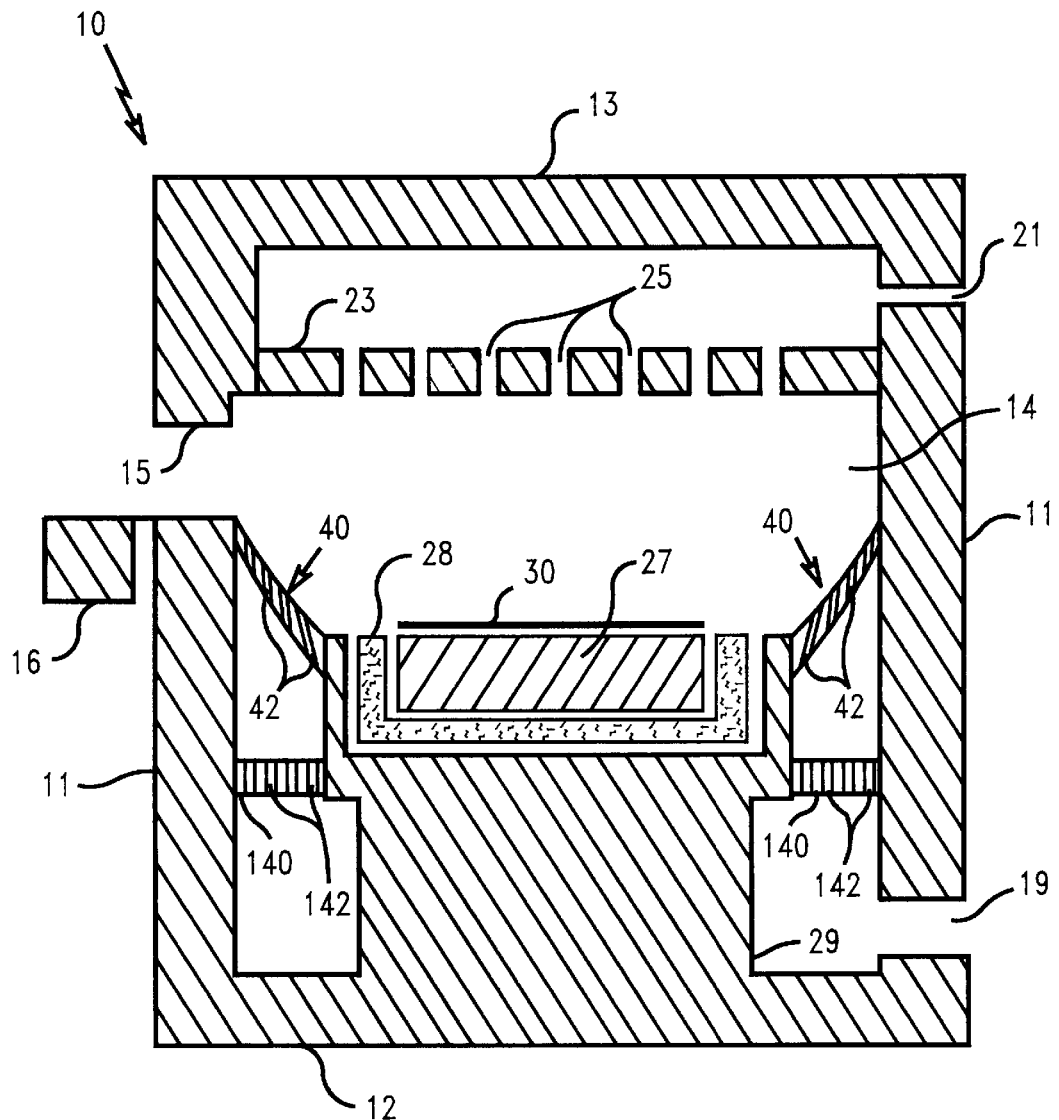
FIG. 1 is a vertical sectional view of a typical cylindrically symmetric reactive ion etch chamber utilizing one embodiment of the containment plate of the present invention.

In describing the preferred embodiment of the present invention, reference will be made herein to FIGS. 1–10 of the drawings in which like numerals refer to like features of the invention. Features of the invention are not necessarily shown to scale in the drawings.

The present invention is useful for various plasma reactors which generate and contain an active plasma for depositing layers of materials, such as polymeric films, or for etching, or a combination of film deposition and etching or surface modification, etc. In the preferred embodiment, the present invention is used in reactive ion etching chambers for processing semiconductor wafers. In accordance with the teachings of this invention a barrier such as a plate is placed along the desired boundary between the plasma region and the remainder of plasma reactor chamber, such as a RIE chamber region, to be free of plasma to contain the plasma. This containment boundary may be flat or curved as desired in accordance with the present invention. This containment structure or barrier (also described herein as a plate) may be made of a conductive material that is capable of obtaining sufficient surface charge as to eliminate electric fields from its interior. For applications where conductance or film deposition on the plate is a particular concern, multiple plates may be used, with the plates closer to the plasma partially attenuating the electromagnetic fields and associated plasma and those further away finishing the job. Such an assembly may use larger holes that have higher conductance and are less susceptible to clogging due to deposits. While the use of multiple plates has advantages, it is believed that they may be not required in most circumstances, and that a single containment plate made in accordance with the present invention will be adequate.

For most applications using RF sources, it is preferred that the plate be electrically connected to the RF circuit, normally to the ground. When high frequency sources such as microwave are utilized, it may be possible to allow the plate to electrically float. The crossover between these two domains is roughly when the width of the surface of the plate becomes large compared to the wavelength of the electromagnetic fields that are providing power to sustain the plasma. When the width of the plate is large compared to the wavelength of the electromagnetic fields that are sustaining the plasma, they behave like photons that may be absorbed or reflected without the need for a net change in the charge on the plate as a whole.

The containment plate of this invention also contains openings to allow the passage of gas molecules through it. These openings are made as large, short and as numerous as possible, given that the plate should have sufficient supporting strength and the plasma must be contained.

To optimize these criteria, the walls of the openings are angled to cause the electromagnetic field that sustains the plasma to fall off rapidly within the openings and become too weak to sustain a plasma before it reaches the other side of the plate. While it has been found that any opening that has a cross-section narrow compared to the wavelength of the electromagnetic field will attenuate the electromagnetic fields if made long enough, the conductance for such an opening may be very low. It is desired to attenuate the fields within the plate while maintaining high conductance. It has been found that to accomplish this, the angle between the incident radiation (the direction of the electric field or Poynting vector, as will be discussed further below) and the wall of the hole should be less than or approximately equal to 90 degrees. An angle substantially less than 90 degrees generally results in faster falloff of the fields, but an angle approximately equal to 90 degrees often yields better conductance while maintaining excellent plasma containment. This will be discussed in more detail below in connection with FIG. 3.

For systems where the wavelength of the electromagnetic fields is very long with respect to the chamber dimensions, the angle of the conductive surfaces is determined with respect to the electrical field direction. This allows for attenuating the electric fields with quasi-static surface charges. It should be noted that while all electric fields are perpendicular to the surface of a perfect conductor, regardless of its angle, the electric field direction considered herein is the electric field direction at the containment plate opening, after accounting for the distorting effects of the plate itself on the electric field.

For systems where the wavelength of the electromagnetic fields is very short with respect to the chamber dimensions, the conductive surface angle is determined with respect to the direction of the Poynting vector. This allows the openings to prevent line of sight transmission of the Poynting vector through the plate, similar to closed venetian blinds keeping out light. In the case of short wavelength, the conductor should be of sufficient thickness to expel all electrical fields from within the plate interior to avoid the oscillating surface charge from acting as a source of additional electromagnetic radiation on the other side of the conductive surface. For wavelengths comparable to the width of the surface of the plate, the analysis is more complex but the design rule remains the same, and the openings are made between conductive material and are shaped so as to cause rapid attenuation of the electromagnetic fields within the openings.

Since there is a preferred orientation for the conductive surfaces to most efficiently attenuate the fields and for applications where the plate will encircle the source of the electromagnetic fields, the preferred opening in the containment plate is annular. It is also advantageous to keep the width of the openings large compared to the molecular mean free path, and this may be facilitated by adjusting the angle of the opening.

While plasma containment may be obtained with a single large opening, the conductance for a given plasma containment capacity suffers in the molecular flow regime. The conductance F for a rectangular slit is given by the equation $$F = 3.638 y A_1 \sqrt{\frac{T}{M}}$$

where T is temperature, M is molecular mass, $A_1$ is the area of the opening, and $$y = 2.66 \frac{abK}{(a+b)l}$$

where a and b are the dimensions of the long and short sides, respectively, of the rectangular opening, and l is the length of the opening. K is a constant of order unity that is a function of b/a, growing from 1 to ~1.5 as the ratio decreases. For the common case where a>>b, $$y = 2.66 \cdot \left(1 - \frac{b}{a}\right) \cdot \frac{bK}{l}$$

to first order in b/a.

For the common case where a>>b, the attenuation of the electromagnetic field can be approximated as a function of the ratio b/l only. For example, one may consider the simple comparison of two plates, one consisting of a single opening and the second consisting of two openings, both of which have the same ratio of $\frac{1}{4}$ to keep the attenuation of the electromagnetic fields equal. Since the circumference of the openings is generally dictated by chamber size, a will be the same for the one and the two slit situations marking the ratio $b/a$ will be smaller for the two opening situation. The conductance of the one slit will then be slightly lower than the two slit situation, as both the $$\left(1 - \frac{b}{a}\right)$$

term and the K term are smaller for the two slit situation. This line of reasoning can be extended to greater numbers of slits, so that for the same amount of electromagnetic field attenuation, a greater number of slits give a larger conductance for the same amount of electromagnetic field attenuation. The aforementioned analysis was done using the molecular flow model of an openings conductance, so for situations where the molecular flow regime is avoided, as is preferred, the above analysis should be revisited.

The neutralization of the ions in the plasma depends on the ions striking the conductive plate, interacting with other ions that have struck the plate or interacting with free electrons. Since the free electrons interact with great speed independently of the presence of plates, their effect should not be substantially different for the single or double opening plates that have been considered. Ion interaction with other molecules that have struck the plate will be very dependent on other molecules striking conductive plates, and these interactions cannot change the net charge of the gas. For these reasons the effectiveness of the physical barrier in neutralizing a cold plasma can be measured by its contact rate with the ions. For the case where the molecular mean free path is very short with respect to the spacing between the conductive plates, placing twice the number of plates, even though they are only half as long, will increase the number of ions contacted by them because the longer, more widely separated plates will tend to have the same gas molecules hit the plates repeatedly while other ions will never hit the plates.

It should be noted that, for many applications, once the electromagnetic fields at the plate are effectively attenuated, it is of little consequence whether or not the cold plasma is eliminated rapidly or over a larger distance.

In summary, for two plates having the same $b/a$ ratio, a one opening plate with a length twice that of the lengths of the two openings in the other plate, both plates will have nearly identical electromagnetic attenuation, while the two opening plate will have slightly better conductance (assuming molecular flow) and will have better "cold plasma" attenuation properties outside of the molecular flow regime.

These findings are expandable to plates with many openings. The benefits of multiple openings are quickly negated once the opening width becomes narrow enough such significant conductance is lost due to the thickness of deposits on the plate. At this point a conductance versus attenuation tradeoff must be made, but is not nearly as severe of a tradeoff as faced when using plasma confinement based on the plasma sheath.

The structure of the present invention may be coated with an insulator, such as an anodized coating. However, since the effective width for conductance is the space between the insulated surface and the effective width for electromagnetic attenuation is the space between the conductive surfaces, a very thick insulating coating is less desirable in terms of conductance versus electromagnetic attenuation.

Figure 2:
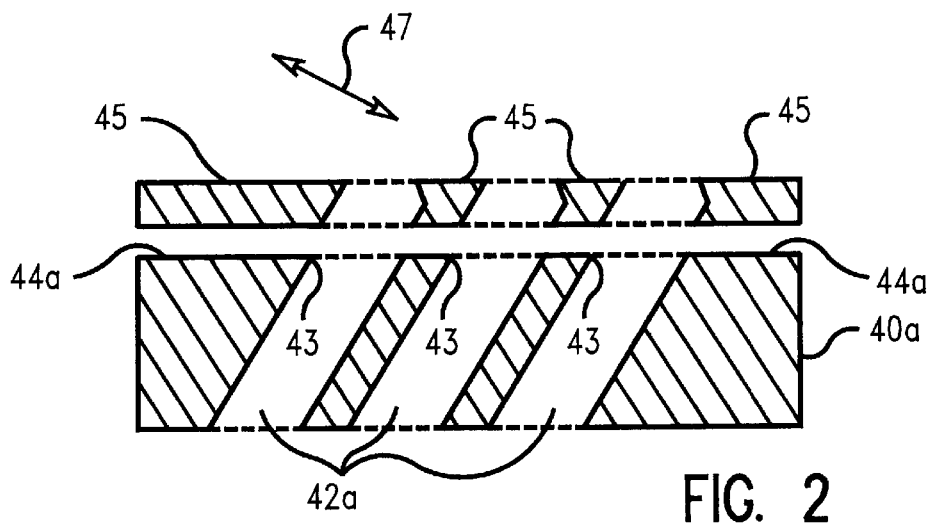
FIG. 2 is a vertical sectional view, cut radially, of a portion of a containment plate, constructed in accordance with the present invention, having deposits on the upper plate surface facing the stronger electromagnetic field.

The openings through the containment plate preferably have a sharp inside corner, as shown in FIG. 2 (element 43) discussed further below. While this invention will function with rounded inside corners, the conductance gain that this affords is generally offset by the loss of effective electromagnetic attenuation. If the plasma containment is more than sufficient and it is desired that the conductance be raised, it is preferred that the thickness of the plate be reduced, thus making the path through the opening that the gas molecules must travel down shorter, or the openings be widened.

It should also be noted that the containment structure of the present invention may permit a cold plasma to exist in the portion of the reactor chamber on the side of the plate opposite the active plasma. The term active plasma is used to denote the plasma which exists in an electromagnetic field sufficient to sustain the plasma. Since the structure of the present invention may permit flow of ions which are not neutralized, these ionized molecules may form a cold plasma on the side of the containment structure opposite the workpiece. As used herein, the term containment structure refers to both containment of an active plasma and/or containment of an electromagnetic field. Additionally, the structure may or may not contain the cold plasma.

FIG. 1 depicts one embodiment of the RIE system of the present invention, which is based on a TEL Unity II available from Tokyo Electron Limited. The system includes a plasma reactor 10 which has a base plate 12, a cylindrical sidewall 11 and a top lid 13 surrounding a chamber 14. A processing or reactive gas input or inlet 21 permits gas to enter the chamber. A manifold 23 with a plurality of apertures 25 is centrally disposed with respect to cylindrical sidewall 11 (typically extending laterally about 150 mm) and is disposed between the sidewall 11 and the top lid 13 of the chamber. Chamber base plate 12, sidewall 11, top lid 13 and manifold 23 are preferably made of an electrically conductive material such as aluminum and are connected to electrical ground. A cathode 27, also preferably made of aluminum, is disposed on but electrically insulated from pedestal 29 and base plate 12 and a pedestal 29, which preferably has an anodized surface. Cathode 27, supports an electrostatic chuck (not shown). A positive voltage is applied to the electrostatic chuck to firmly hold wafer 30 on the pedestal by appropriately charging the chuck. An insulator 28 or set of insulators surround the cathode on all sides but the top.

A wafer handler (not shown) carries the wafer 30 into and out of the chamber through a slit 15 located in the sidewall on the left side of the chamber. A hinged slit valve 16 is provided to close the chamber when the wafer handler is withdrawn. A wafer lift mechanism (not shown) is provided to transfer the wafer from the wafer handler to the electrostatic chuck prior to processing and from the electrostatic chuck to the wafer handler after the processing is completed. A quartz window for viewing the interior of the chamber may be provided in the chamber sidewall.

An RF system may be connected to the cathode to produce a plasma region between the wafer, plate, chamber sidewalls and the gas input manifold. A water cooling system may be provided for cooling the cathode and a helium cooling system may be provided for cooling the wafer.

The system described herein above is generally known and is of a standard type used in the semiconductor processing industry, and is also disclosed in U.S. Pat. No. 5,639,334, the disclosure of which is hereby incorporated by reference.

In accordance with the teachings of this invention, a containment structure 40 is placed at the desired boundary between where the active plasma is desired and where no active plasma is desired. Containment structure 40 contains openings 42 to permit process gasses to flow from the inlet 21, through the manifold 23, through the containment structure 40 and out pumping port 19. A pump (not shown) discharges the processing gas from pumping port 19 to a processing gas output.

The containment structure made according to the teachings of this invention preferably has a plate configuration and is designed to be incorporated in a semiconducting etch chamber similar to the one shown in FIG. 1, although it may be incorporated into other plasma reactors of other designs. This containment structure or plate has a large, relatively stable conductance and excellent confinement properties even when the molecular mean free path is long compared to the dark space and when a film is being deposited on the plate.

The containment plate is electrically conductive (e.g., anodized aluminum) and is electrically grounded and is used in a chamber that uses 13.56 MHz electromagnetic fields to sustain the plasma. A protective coating such as a thin ceramic may cover the plate to protect the plate. For the RIE chamber depicted herein, conductive rings form annular openings to attenuate the electromagnetic field, which rings may be held in place by supporting struts below the rings. These struts connect the conductive rings both mechanically and electrically and are placed below the rings to eliminate deposition on the struts which would reduce the conductance of the plate.

This plate contains openings (42) to allow the passage of gas molecules through it. These openings are larger in two dimensions, i.e., the width and the length of the openings as seen in plan view (see FIG. 6, opening width in direction of radial arrow 51, opening length in direction of circumferential arrow 53) than both the plasma sheath and the molecular mean free path. They are as large, short (through the thickness of the structure) and as numerous as possible given the restraint that the plate must have sufficient mechanical strength and the plasma must be contained. Due to the very long wavelength of the 13.56 MHz fields with respect to the plate width, the walls of the openings may be angled such that they are approximately perpendicular to the electric field that sustains the plasma. This causes the electromagnetic fields to fall off very rapidly within the openings and become too weak to sustain a plasma before they reach the other side of the plate.

The openings at regions of high electromagnetic field strength (e.g., close to the cathode) should be thinner and deeper than those at regions of lower electromagnetic field strength. While the openings at regions of high electromagnetic field strength need to have a large aspect ratio (the ratio of the width of the opening as seen in plan view to the depth dimension of the opening through the thickness of the plate) to attenuate the strong electromagnetic fields, those openings that have a weaker electromagnetic field to attenuate may use a smaller aspect ratio, and thereby have a larger conductance.

The containment structure of the present invention may include a plurality of containment plates, e.g., containment plate 140 containing openings 142 in FIG. 1, adapted to progressively attenuate the plasma and electric field in the chamber.

FIG. 2 depicts an elevational view of a radial section of a portion of containment plate 40a wherein the cathode is to the left of the section as shown. Deposits 45 are shown on the top surface of the plate facing the stronger electromagnetic field. The electric field direction in the vicinity of the plate 40a and openings 42a is shown by arrow 47. Openings 42a may be defined by uncoated, free conductive surfaces, or the conductive surfaces may be embedded in a dielectric material (e.g., a dielectric coating). Plate openings 42a have a sharp inside corners 43 on the upper surface 44a of the plate (facing the active plasma in the chamber) on the edge closest the cathode and workpiece. If and when deposits form on the upper plate surface 44a, this configuration will reduce the tendency of the deposits 45 to fill up or clog the openings 42a. This configuration also maximizes conductance for a given amount of electromagnetic attenuation.

Figure 3:
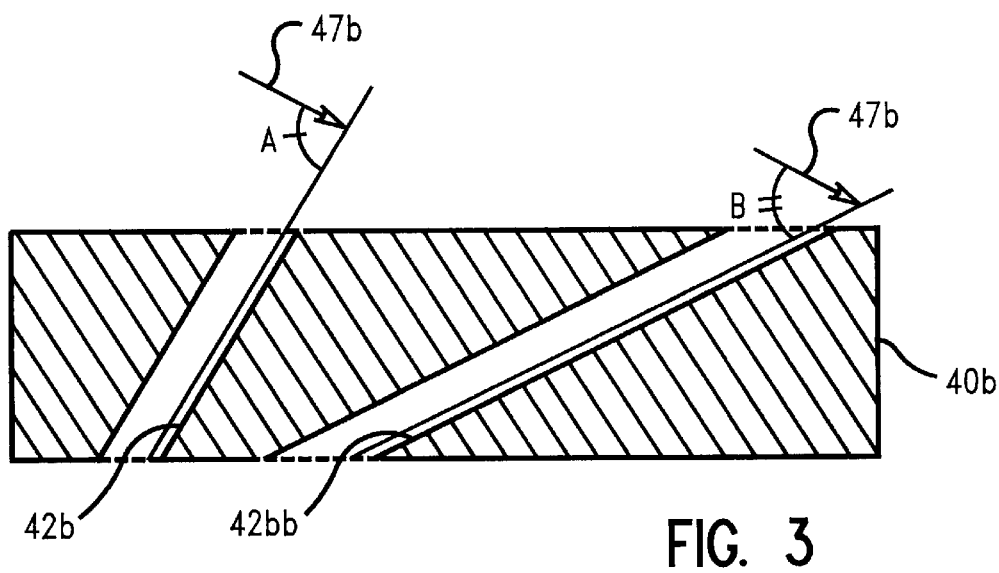
FIG. 3 is a vertical sectional view, cut radially, of a portion of a containment plate constructed in accordance with the present invention with openings set at two different angles with respect to the direction of the electric field or Poynting vector.

Different conductive surface angles in the containment plate are shown in FIG. 3. The vertical elevational view of plate 40b has a first conductive surface 42b at one angle and a second conductive surface 42bb at a second, more acute angle. The cathode and workpiece are again situated to the left and the local electric field direction is shown by arrows 47b. Plate conductive surface 42b angle A is less than or approximately equal to 90 degrees with respect to the electric field vector and plate conductive surface 42bb angle B is substantially less than 90 degrees. A conductive surface with angle B would result in faster falloff of the fields, but a conductive surface with angle A often yields better conductance while maintaining excellent plasma containment.

Figure 4:
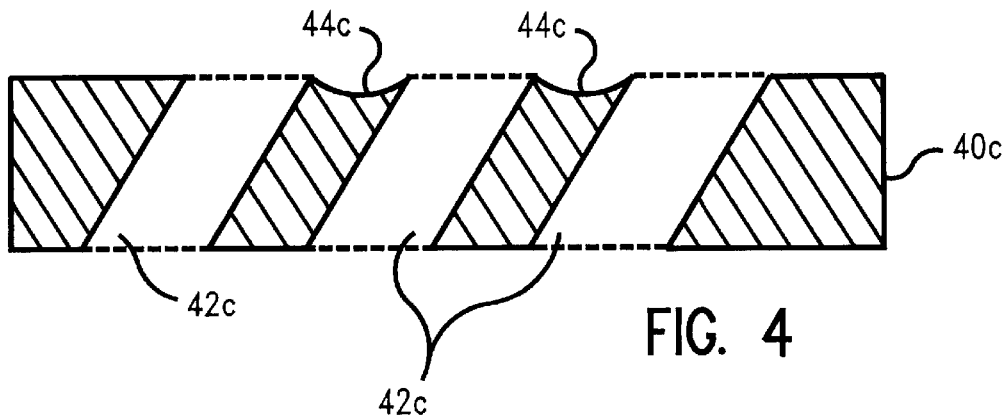
FIG. 4 is a vertical sectional view, cut radially, of a portion of a containment plate constructed in accordance with the present invention that includes a concave surface on the plasma side of the containment plate.

The plate surface on the plasma side may also be made concave, as shown in FIG. 4, wherein upper surface 44c of plate 40c, between openings 42c, has a concave shape. This concave shape reduces the tendency for the deposits to form a bread loaf shape (45 in FIG. 2) and prematurely reduce the conductance of the plate. While a very useful technique for very critical applications, in many instances the additional expense of including this concave surface will be not needed. Ideally this surface should be minimized by making the conductive surfaces thin, but the need for the plate to have some structural strength limits this.

FIG. 5 depicts a bottom plan view (the side away from the active plasma) of another containment plate made in accordance with the present invention for use around a cathode and workpiece in a RIE chamber. Plate 40d made of aluminum with an anodized coating of about 50 microns thickness is of thickness 6 mm and has a series of rings 50 (FIG. 6) forming between adjacent ones annular openings 42d of width 1.4 mm at an angle of 60° from horizontal. For structural integrity, a plurality of struts 49 are placed radially about the plate to secure the rings. As shown in elevational detail in FIG. 7, openings 42d do not pass completely through the plate 40d above strut 49. However, such openings 42d do pass completely through at portions away from the struts, in the manner shown in previous figures. Such openings have widths in direction of arrow 51 and lengths in direction of arrow 53 (as seen in the enlarged plan view in FIG. 6) which are each greater than the plasma sheath within the portion of the chamber containing the active plasma.

Figure 8:
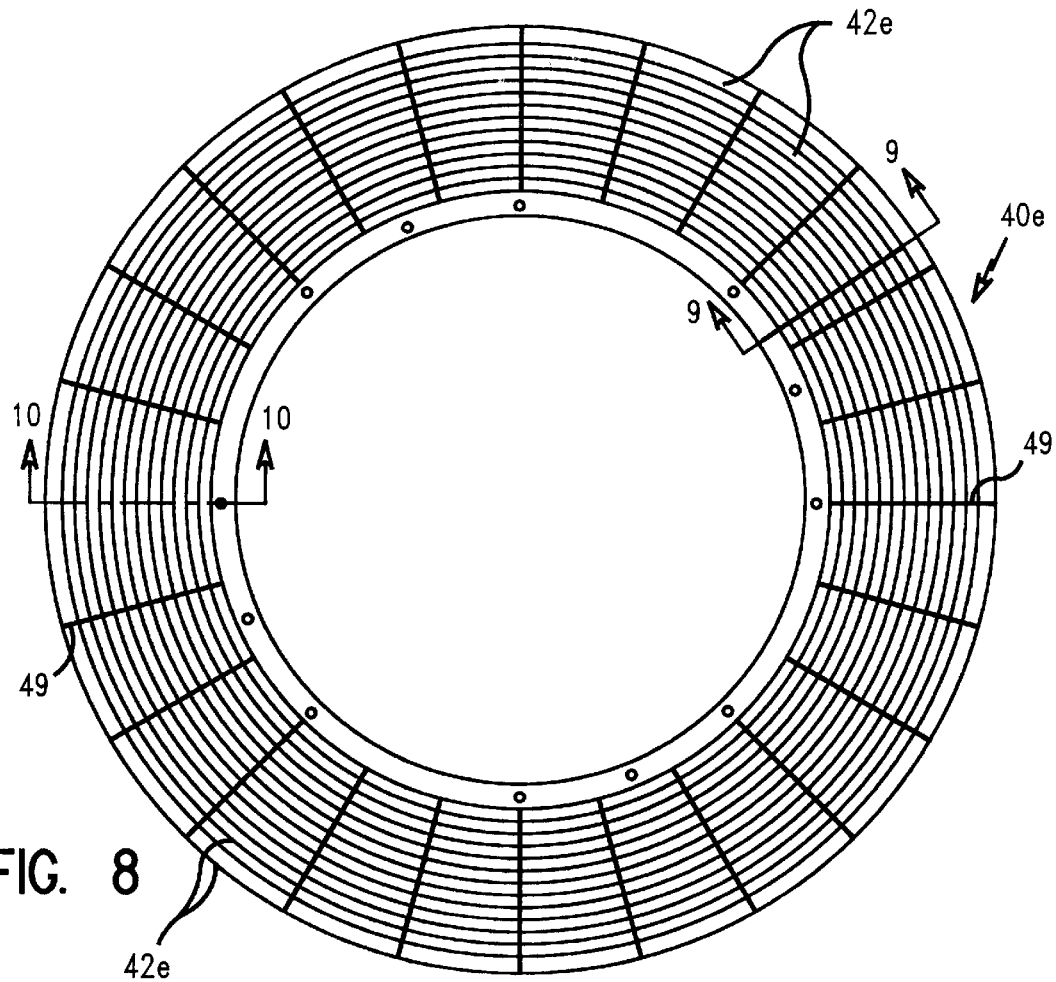
FIG. 8 is a bottom (facing the weaker electromagnetic field) plan view of another containment plate constructed in accordance with the present invention, with openings of decreasing aspect ratio from the inner diameter to the outer diameter of the plate.
Figure 9:
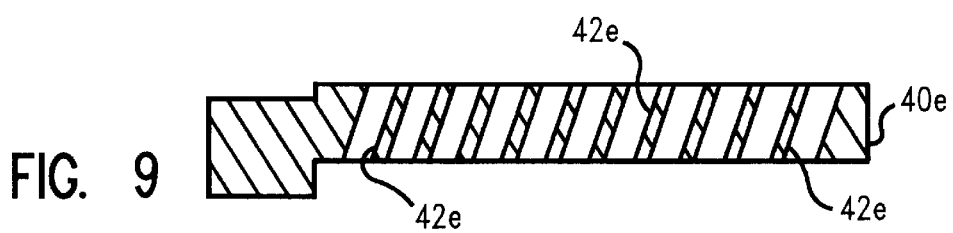
FIG. 9 is a vertical sectional view of the containment plate along line 9—9 of FIG. 8 showing the varying size openings.
Figure 10:
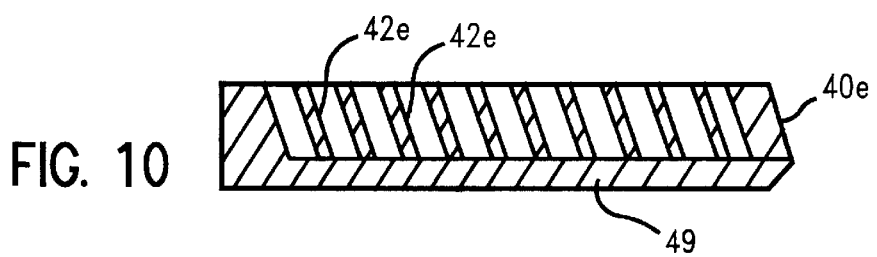
FIG. 10 is a vertical sectional view of the containment plate along line 10—10 of FIG. 8.

FIGS. 8, 9 and 10 depict another preferred embodiment of the containment plate in which the size of the openings varies according to the distance from the center of the plate where the workpiece and cathode would be located. Plate 40e has annular rings separated by openings 42e with the plate having a thickness of 5.8 mm at the openings. Struts 49 provide the connecting structure for the rings. As shown in FIGS. 9 and 10, the width of openings 42e increase from 0.8 mm at the inner diameter to 2.8 mm at the outer diameter of the plate. The variation in opening width provides a more severe aspect ratio in the center where the electric field is stronger.

In general, the conductive surfaces in the containment plate are preferably perpendicular to the local electric field that induces the plasma, and the width of the openings is about one-half the thickness of the plate. Typically, the openings have a width of about 1 to 50 mm, and the plates have a thickness of about 5 to 50 mm. The openings need not be small compared to the sheath distance to contain the plasma, since the plasma is contained by the rapid elimination of the magnetic field within the plate itself. Preferably, the opening width is at least 1–3 times the molecular mean free path of the plasma and 2–3 times the thickness of expected deposits on the plate.

The high conductance obtained through the containment plate made in accordance with the present invention is higher than can be obtained by prior art sheath confinement configurations, and such conductance levels tend to remain consistently higher throughout use of the plate. In one example in a TEL Unity II RIE chamber, gas flow was 1 std liter/min thru plate and pressure was maintained at 50 millitorr in chamber. Utilizing prior art sheath plates, the initial pressure drop across the plate was 20 millitorr. After a deposition of about 2 mm of film, the plate was completely clogged. When the containment plate of the present invention was utilized, as depicted in FIG. 5, the initial pressure drop was 5 millitorr, which indicated 4 times greater conductance. After a deposition of about 2 mm of film, a pressure drop of 18–19 millitorr was measured, and the plate was still functional.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A containment structure for a plasma comprising:

electrically conductive means for containing a plasma, that is sustained by an electromagnetic field, within a desired space by attenuating the electromagnetic field outside of said space to levels which do not sustain the plasma while maintaining high gas conductance across said containment structure; and means for permitting gas flow through said containment structure.

2. The containment structure of claim 1 wherein said structure comprises spaced, overlapping conductive surfaces.

3. The containment structure of claim 1 wherein said means for containing includes openings having overlapping conductive surfaces oriented to prevent line of sight transmission of a vector in the direction of the electric field at said openings to attenuate an electromagnetic field.

4. A plasma reactor comprising:

a reactor chamber adapted to create and sustain a plasma in a space therein;

electrically conductive means for containing a plasma within a desired portion of space in said chamber by attenuating an electromagnetic field generated in said chamber while maintaining high conductance across said containment structure; and means for permitting gas flow within said chamber and through said containment structure.

5. The plasma reactor of claim 4 wherein said reactor chamber contains an anode and a cathode.

6. The plasma reactor of claim 4 wherein said reactor chamber comprises a reactive ion etching chamber.

7. The plasma reactor of claim 4 wherein said means for containing a plasma includes openings having overlapping conductive surfaces oriented to prevent line of sight transmission of a vector in the direction of the electric field at said openings to attenuate an electromagnetic field.

8. A plasma reactor comprising:

a reactor chamber adapted to create and sustain an active plasma in a space therein; and a plasma containment structure comprising electrically conductive means for containing an active, plasma within a desired portion of space in said chamber on one side of said structure by attenuating an electromagnetic field generated in said chamber and permitting passage of ionized molecules while maintaining high conductance across said containment structure, thereby permitting formation of a cold, plasma on the other side of said structure; and means for permitting gas flow within said chamber and through said containment structure.

9. The plasma reactor of claim 8 wherein said reactor chamber contains an anode and a cathode.

10. The plasma reactor of claim 8 wherein said reactor chamber comprises a reactive ion etching chamber.

11. The plasma reactor of claim 8 wherein said means for containing includes openings having overlapping conductive surfaces oriented to prevent line of sight transmission of a vector in the direction of the electric field at said openings to attenuate an electromagnetic field.

12. A containment structure for containing an electromagnetic field and a plasma having a surrounding plasma sheath, said containment structure comprising a structure made of an electrically conductive material configured to contain a plasma within a desired space by attenuating an electromagnetic field outside of said space while maintaining high conductance across said structure, said structure containing openings therethrough for permitting gas flow within said chamber, said openings having two dimensions on a surface of said containment structure greater than said plasma sheath.

13. The containment structure of claim 12 wherein said two dimensions of said openings are greater than the molecular mean free path of said plasma.

14. The containment structure of claim 12 wherein all dimensions of said openings are greater than said plasma sheath.

15. The containment structure of claim 12 wherein said structure comprises spaced, overlapping conductive surfaces.

16. The containment structure of claim 15 wherein said conductive surfaces form said openings for the gas flow.

17. A containment structure for a chamber containing an electromagnetic field, said containment structure comprising a structure made of an electrically conductive material configured to contain an electromagnetic field within a desired space in said chamber by attenuating said field generated in said chamber while maintaining high conductance across said structure, said structure containing openings having surrounding conductive surfaces therethrough for permitting gas flow within said chamber, said openings having a width and a length such that the ratio of the width to length of the openings is sufficient to attenuate said electromagnetic field, said surfaces being oriented in a direction less than or substantially equal to 90° from the direction of the electromagnetic field at said opening.

18. A chamber containing an electromagnetic field and including a containment structure, said containment structure comprising a plate made of an electrically conductive material configured to contain an electromagnetic field within a desired space in said chamber by attenuating said field generated in said chamber while maintaining high conductance across said plate, said plate containing openings having surrounding conductive surfaces therethrough for permitting gas flow within said chamber, said openings having a width and a length such that the ratio of the width to length of the openings is sufficient to attenuate said electromagnetic field, said surfaces being oriented in a direction less than or substantially equal to 90° from the direction of the electromagnetic field at said opening.

19. A containment structure for a plasma comprising:
openings through said structure permitting gas flow through said containment structure; and
means for containing a plasma, that is sustained by an electromagnetic field, within a desired space by attenuating the electromagnetic field outside of said space to levels which do not sustain the plasma while maintaining high conductance across said containment structure; said means for containing a plasma comprising electrical conductive surfaces oriented in a direction less than or substantially equal to 90° from the direction of the electric field or Poynting vector, at said openings, of the energy source sustaining said plasma.

20. The containment structure of claim 19 wherein said plasma has a plasma sheath and two dimensions of said openings along a surface of said containment structure are greater than said plasma sheath.

21. The containment structure of claim 19 wherein said conductive surfaces form said openings.

22. A containment structure for a plasma comprising:
means for containing a plasma, that is sustained by an electromagnetic field, within a desired space by attenuating the electromagnetic field outside of said space to levels which do not sustain the plasma while maintaining high conductance across said containment structure, said means for containing a plasma comprising spaced, overlapping electrical conductive surfaces forming openings, said conductive surfaces oriented in a direction less than or substantially equal to 90° from the direction of the electric field at said opening; and
means for permitting gas flow through said containment structure.

23. A containment structure for a plasma comprising:
means for containing a plasma, that is sustained by an electromagnetic field, within a desired space by attenuating the electromagnetic field outside of said space to levels which do not sustain the plasma while maintaining high gas conductance across said containment structure, said means for containing a plasma maintaining high conductance in the presence of deposits from said plasma on said containment structure; and
means for permitting gas flow through said containment structure.

24. A plasma reactor comprising:
a reactor chamber adapted to create and sustain a plasma in a space therein;
a containment structure within said chamber having openings through said structure permitting gas flow within said chamber; and
means for containing a plasma within said containment structure by attenuating an electromagnetic field generated in said chamber while maintaining high conductance across said containment structure; said means for containing a plasma comprising electrical conductive surfaces oriented in a direction less than or substantially equal to 90° from the direction of the electric field at said openings.

25. The plasma reactor of claim 24 wherein said conductive surfaces form said openings.

26. A plasma reactor comprising:
a reactor chamber adapted to create and sustain an active plasma in a space therein; and
a plasma containment structure comprising openings through said structure permitting gas flow within said chamber and through said containment structure; and means for containing an active, plasma within a desired portion of space in said chamber on one side of said structure by attenuating an electromagnetic field generated in said chamber and permitting passage of ionized molecules while maintaining high conductance across said containment structure, thereby permitting formation of a cold, plasma on the other side of said structure, said means for containing a plasma comprising conductive surfaces oriented in a direction less than or substantially equal to 90° from the direction of the electric field at said openings.

27. The plasma reactor of claim 26 wherein said plasma has a plasma sheath and two dimensions of said openings parallel to a surface of said containment structure are greater than said plasma sheath.

28. The plasma reactor of claim 26 wherein said conductive surfaces form said openings.

29. A containment structure for containing an electromagnetic field and a plasma having a surrounding plasma sheath, said containment structure comprising a structure made of an electrically conductive material having spaced, overlapping conductive surfaces connected by struts, said structure configured to contain a plasma within a desired space by attenuating an electromagnetic field outside of said space while maintaining high conductance across said structure, said structure containing openings therethrough for permitting gas flow within said chamber, said openings having two dimensions on a surface of said containment structure greater than said plasma sheath.

30. The containment structure of claim 29 wherein said structure has a surface facing toward said plasma and wherein said struts are placed away from said surface.

31. A containment structure for containing an electromagnetic field and a plasma having a surrounding plasma sheath, said containment structure comprising a structure made of an electrically conductive material configured to contain a plasma within a desired space by attenuating an electromagnetic field outside of said space while maintaining high conductance across said structure, said structure containing openings therethrough for permitting gas flow within said chamber, said openings having two dimensions on a surface of said containment structure greater than said plasma sheath, said openings further having surrounding walls, and wherein said walls are oriented in a direction less than or substantially equal to 90° from the direction of the electric field at said openings.

32. A containment structure for containing an electromagnetic field and a plasma having a surrounding plasma sheath, said containment structure comprising a structure made of an electrically conductive material configured to contain a plasma within a desired space by attenuating an electromagnetic field outside of said space while maintaining high conductance across said structure, said structure containing annular openings therethrough for permitting gas flow within said chamber, said openings having two dimensions on a surface of said containment structure greater than said plasma sheath.

33. A containment structure for containing an electromagnetic field and a plasma having a surrounding plasma sheath, said containment structure comprising a structure made of an electrically conductive material having a dielectric coating thereover, said structure configured to contain a plasma within a desired space by attenuating an electromagnetic field outside of said space while maintaining high conductance across said structure, said structure containing openings therethrough for permitting gas flow within said chamber, said openings having two dimensions on a surface of said containment structure greater than said plasma sheath.

34. A containment structure for containing an electromagnetic field and a plasma having a surrounding plasma sheath, said containment structure comprising a structure made of an electrically conductive material configured to contain a plasma within a desired space by attenuating an electromagnetic field outside of said space while maintaining high conductance across said structure, said structure having a surface facing said plasma and containing openings therethrough for permitting gas flow within said chamber, said openings having surrounding walls wherein the angle between said surface and a portion of said walls is less than 90° and two dimensions on the surface of said containment structure greater than said plasma sheath.

35. A containment structure for containing an electromagnetic field and a plasma having a surrounding plasma sheath, said containment structure comprising a structure made of an electrically conductive material configured to contain a plasma within a desired space by attenuating an electromagnetic field outside of said space while maintaining high conductance across said structure, said structure having a surface facing said plasma containing openings therethrough for permitting gas flow within said chamber, a portion of said surface between said openings being concave, said openings having two dimensions on the surface greater than said plasma sheath.

36. A containment structure for containing an electromagnetic field and a plasma having a surrounding plasma sheath, said containment structure comprising a structure made of an electrically conductive material configured to contain a plasma within a desired space by attenuating an electromagnetic field outside of said space while maintaining high conductance across said structure, said structure containing openings therethrough for permitting gas flow within said chamber, said openings having two dimensions on a surface of said containment structure greater than said plasma sheath, said openings further having surrounding walls with electrically conductive surfaces.

37. A containment structure for containing an electromagnetic field and a plasma having a surrounding plasma sheath, said containment structure comprising a structure made of an electrically conductive material configured to contain a plasma within a desired space by attenuating an electromagnetic field outside of said space while maintaining high conductance across said structure, said structure containing openings therethrough for permitting gas flow within said chamber, said openings having two dimensions on a surface of said containment structure greater than said plasma sheath, said openings further containing overlapping conductive surfaces oriented to prevent line of sight transmission of a vector in the direction of the electric field at said opening to attenuate an electromagnetic field.

38. A containment structure for containing an electromagnetic field and a plasma having a surrounding plasma sheath, said containment structure comprising a structure made of an electrically conductive material configured to contain a plasma within a desired space by attenuating an electromagnetic field outside of said space while maintaining high conductance across said structure, said structure containing openings therethrough for permitting gas flow within said chamber, said openings having two dimensions on a surface of said containment structure greater than said plasma sheath, said openings having a width and a depth, wherein the ratio of the width to depth of the openings varies across the structure as a function of strength of said electromagnetic field.

39. A plasma reactor comprising a reactor chamber adapted to create and sustain a plasma and a surrounding plasma sheath in a space containing an electromagnetic field; and a containment structure in said chamber made of an electrically conductive material and being configured to contain a plasma within a desired space in said chamber by attenuating an electromagnetic field generated in said chamber while maintaining high gas conductance across said structure, said structure containing openings therethrough for permitting gas flow within said chamber, said openings having two dimensions, parallel to a surface of said containment structure, greater than said plasma sheath.

40. The plasma reactor of claim 39 wherein said structure comprises a plurality of containment plates adapted to progressively attenuate said plasma and electromagnetic field.

41. The plasma reactor of claim 40 wherein said structure comprises spaced, overlapping conductive surfaces.

42. The plasma reactor of claim 41 wherein the spaces between said surfaces comprise said openings for the gas flow.

43. The plasma reactor of claim 41 wherein said structure has a surface facing toward said plasma and wherein said structure further contains struts connecting said conductive surfaces away from the plasma-facing surface.

44. The plasma reactor of claim 39 wherein said openings contain conductive surfaces, and wherein said surfaces are oriented in a direction less than or substantially equal to 90° from the direction of the electric field at said opening.

45. The plasma reactor of claim 39 wherein said structure has a surface facing said plasma and a portion of the plasma-facing surface is between said openings, and wherein said portion of said plasma-facing surface is concave.

46. The plasma reactor of claim 39 wherein said openings contain overlapping conductive surfaces oriented to prevent line of sight transmission of a vector in the direction of the electric field at said opening to attenuate an electromagnetic field.

47. The plasma reactor of claim 39 wherein said openings have a width and a depth, and wherein the ratio of the width to depth of the openings varies across the structure as a function of strength of said electromagnetic field.

48. The plasma reactor of claim 39 wherein said reactor chamber contains an anode and a cathode.

49. The plasma reactor of claim 39 wherein said reactor chamber comprises a reactive ion etching chamber.

* * * * *